United States Patent [19]

Chen et al.

[11] Patent Number: 5,482,881
[45] Date of Patent: Jan. 9, 1996

[54] METHOD OF MAKING FLASH EEPROM MEMORY WITH REDUCED COLUMN LEAKAGE CURRENT

[75] Inventors: Jian Chen; Yuan Tang, both of San Jose; Scott Luning, Menlo Park; Salvatore F. Cagnina, Los Altos, all of Calif.

[73] Assignee: Advanced Micro Devices, Inc., Sunnyvale, Calif.

[21] Appl. No.: 403,460

[22] Filed: Mar. 14, 1995

[51] Int. Cl.$^6$ ............................................. H01L 21/8247
[52] U.S. Cl. ................... 437/43; 437/35; 437/154
[58] Field of Search ................... 437/35, 43, 154, 437/156, 984

[56] References Cited

U.S. PATENT DOCUMENTS

| | | | |
|---|---|---|---|
| 4,698,787 | 10/1987 | Mukherjee et al. | 257/316 |
| 5,100,818 | 3/1992 | Arima et al. | 437/43 |
| 5,120,671 | 6/1992 | Tang et al. | 437/43 |
| 5,335,198 | 8/1994 | Van Buskirk et al. | 365/185 |
| 5,364,806 | 11/1994 | Ma et al. | 437/43 |

*Primary Examiner*—Chandra Chaudhari
*Attorney, Agent, or Firm*—Michael A. Lechter

[57] ABSTRACT

A flash EEPROM having reduced column leakage current suitably includes cells with more uniform erase times arranged in an array. An intermediate n+ implant immediately following the DDI implant step suitably provides an enhanced doping profile in the tunneling region, which increases the rate at which F-N tunneling occurs to erase the cells, and which increases the uniformity of F-N tunneling rates among memory cells within the array. A thermal cycle drives the intermediate n+ implant deeper into the tunneling region. Alternatively, an n+ implant may be performed at a relatively large angle with respect to the semiconductor substrate, which improves the doping concentration in the tunneling region of the source.

23 Claims, 16 Drawing Sheets

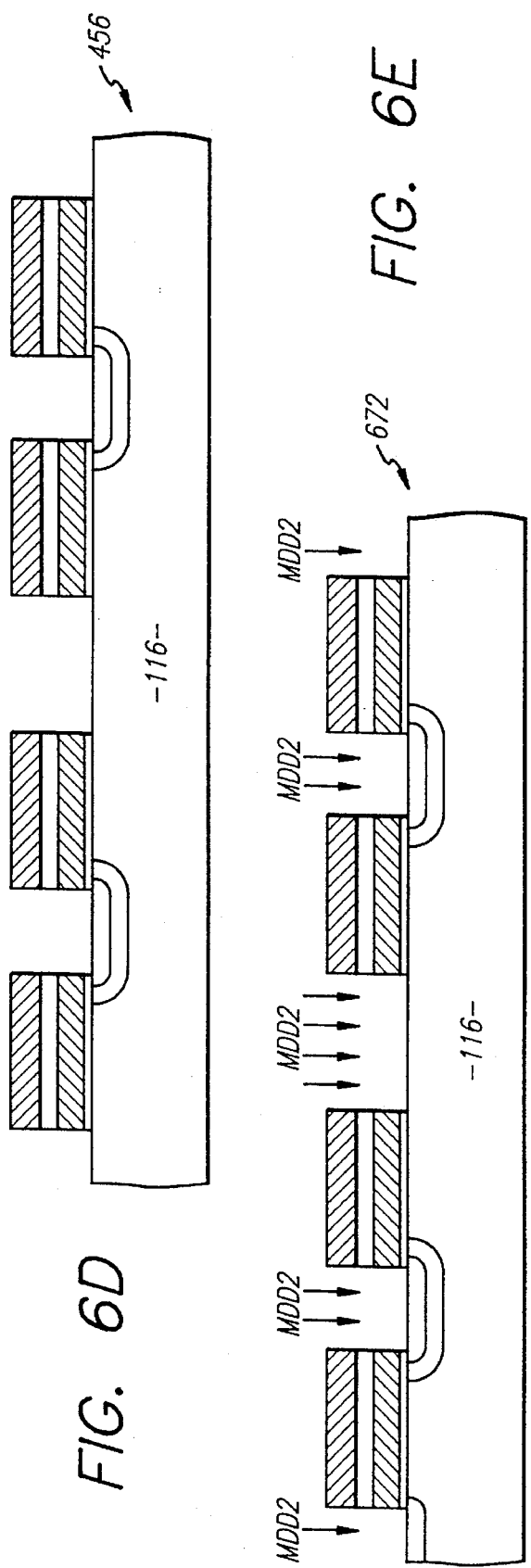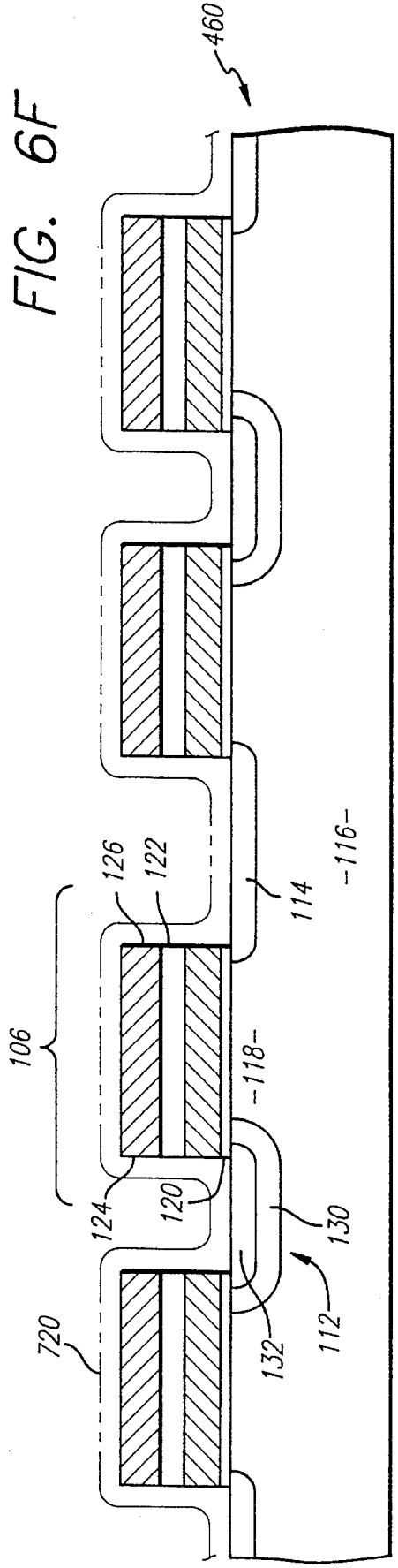

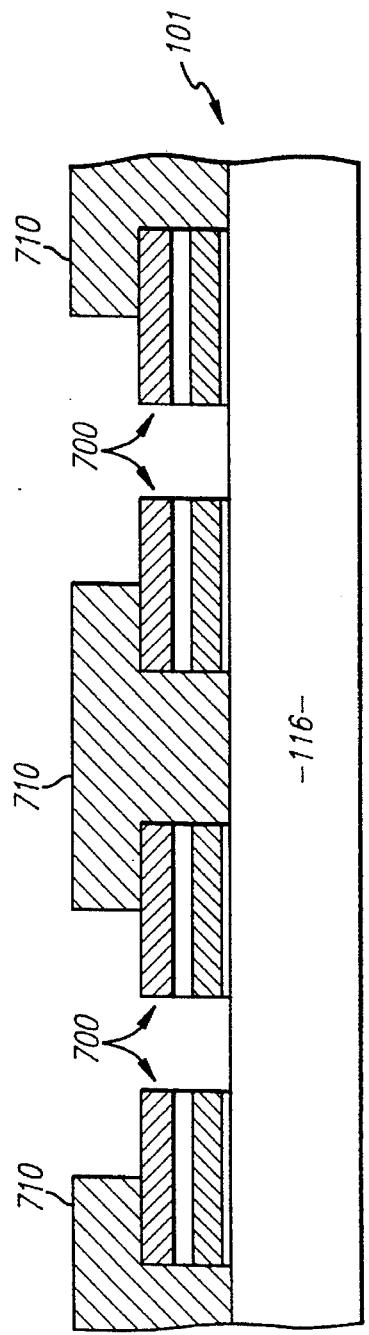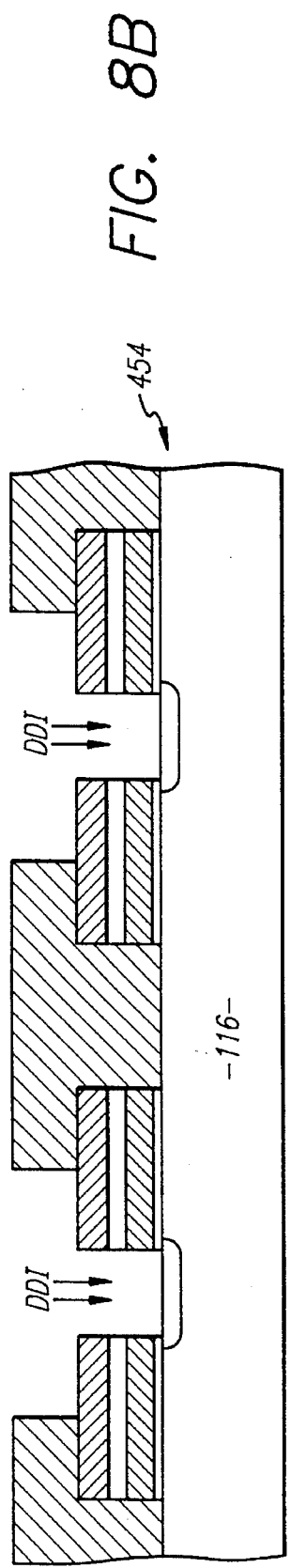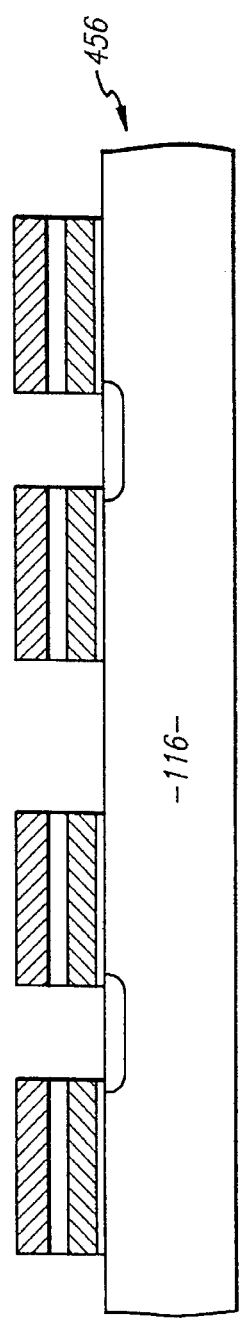

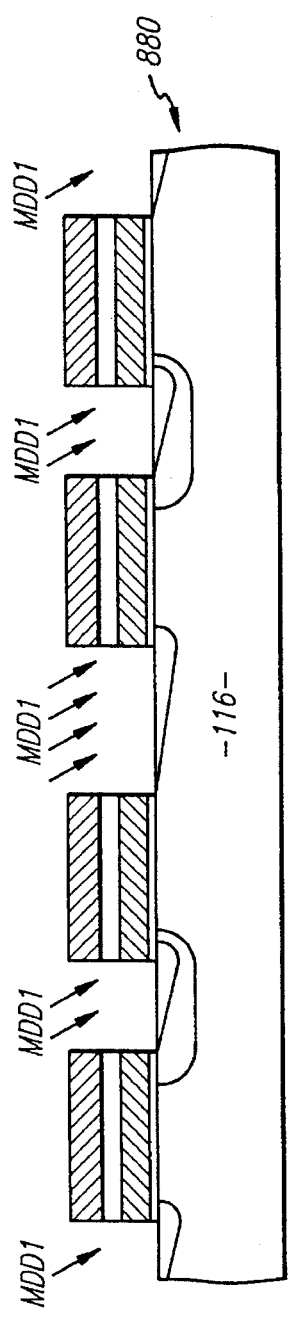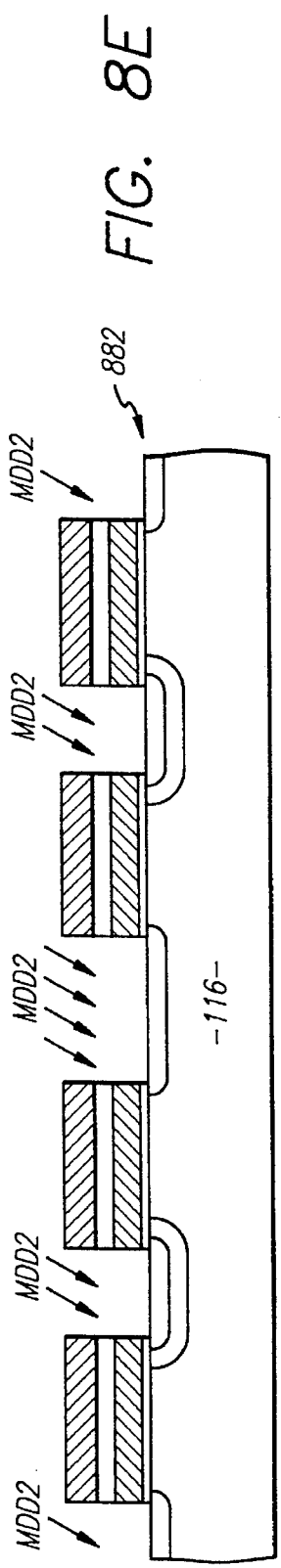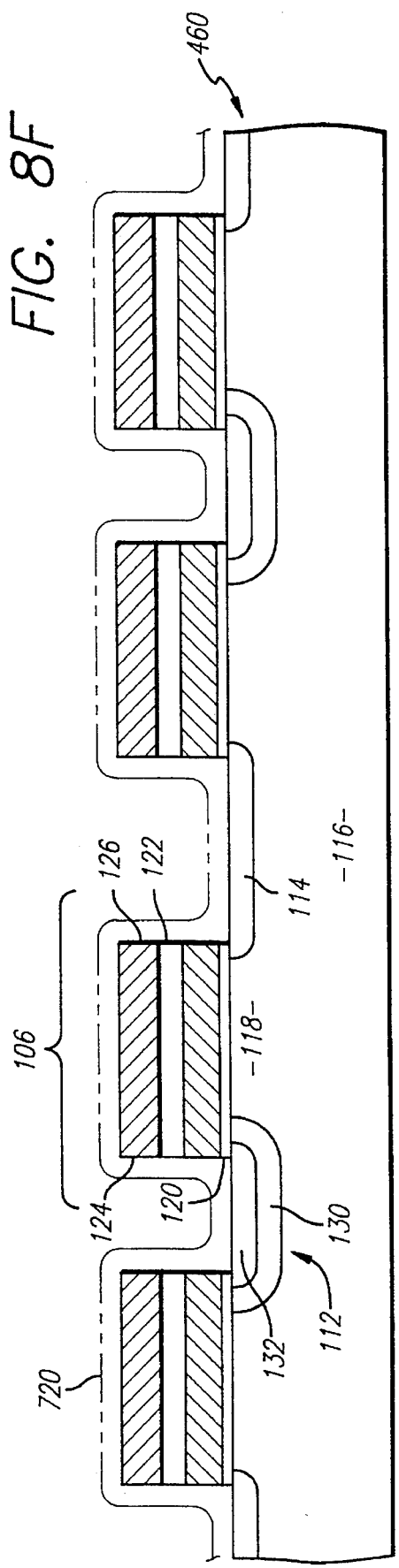

METHOD OF MAKING FLASH EEPROM MEMORY WITH REDUCED COLUMN LEAKAGE CURRENT

BACKGROUND OF THE INVENTION

1. Field of the Invention

The present invention relates to semiconductor devices, and more particularly, to the design and manufacture of floating gate memory devices such as flash electrically erasable programmable read-only memory (EEPROM) devices having improved and more uniform performance characteristics.

2. Description of the Related Art

Computer systems and other modern electronic equipment typically store information in electronic memories. Although the types of memories vary widely, most of such memories, if not all, store information in binary form as a series of logical ones and zeros. In many ways, memories are analogous to a set of switches; if a particular switch is on, it provides a logical one, and conversely, if the switch is off, it provides a logical zero. Information is thus stored by selectively turning the various switches on and off.

A flash electrically erasable programmable read only memory (EEPROM), for example, typically comprises an array of cells that may each be selectively switched on and off. For example, U.S. Pat. No. 4,698,787, to Mukherjee et al., issued Oct. 6, 1987, describes in detail the structure and operation of such a flash EEPROM.

More specifically, referring to FIGS. 1 and 2, a flash EEPROM device typically comprises an N×M array 104 of individual memory cells 110 and various control circuits (not shown) for programming, reading, and erasing cells 110. Each cell 110, as shown in FIG. 1, typically includes: a double-diffused n-type source 112 and an n-type drain 114 formed in a p-type substrate 116; a channel 118 disposed in substrate 116 between source 112 and drain 114; a floating gate 122 overlying channel 118 and overlapping the edges of drain 114 and source 112; a layer of dielectric, known as the tunnel dielectric 120, separating floating gate 122 from source 112, drain 114, and channel 118; a control gate 126 overlying floating gate 122; and a second layer of dielectric, known as the interpoly dielectric 124, separating floating gate 122 from control gate 126. Double-diffused source 112 is commonly formed by performing a first relatively light diffusion driven deep into the substrate, followed by a second higher density but shallower doping. When a voltage in excess of a threshold value is applied to the control gate 126 of a cell 110, and when proper biasing conditions are applied to source 112 and drain 114, channel 118 of the cell conducts electrons 136 from source 112 to drain 114 of the cell.

Array 104 (FIG. 2) typically includes a large number of cells 110, e.g. 1,000 or more, arranged in a series of rows and columns. Each row is driven by an associated word line (WL), comprising a conductive polysilicon layer that forms control gate 126 of each cell 110 within the row. Each column is driven by an associated bit line (BL) comprising an overlying layer of metal connected to each drain 114 of the cells 110 within the column. The cells in a column are arranged such that adjacent cells share a common semiconductor region as source or drain regions. Source 112 of each cell 110 within array 104 is coupled to a common source line CS formed by a conductive path diffused in substrate 116. Any individual cell 110 within array 104 can be individually addressed (programmed and read) by operating upon one word line and one bit line.

Referring again to FIG. 1, an individual cell 110 is programmed by charging floating gate 122 through high energy electron injection, often referred to as hot electron injection. By applying the appropriate potentials to source 112, drain 114, and control gate 126, hot electrons 136A are injected from channel 118 through tunnel dielectric 120 to negatively charge floating gate 122. Charging floating gate 122 with a negative potential raises the threshold voltage of cell 110 by a predetermined amount $V_e$ from a first nominal value $V_{T1}$ to a second nominal value $V_{T2}$. As a result, a programmed cell 110 ($V_T > V_{T2}$) conducts substantially less current during a subsequent read operation than an unprogrammed cell 110 ($V_T < V_{T1}$) having no charge on floating gate 122.

During a read operation, a predetermined voltage $V_G$ is applied to control gate 126 of selected cell 110. If the selected cell 110 is unprogrammed ($V_T < V_{T1}$), the gate voltage $V_G$ exceeds the threshold voltage $V_{T1}$ of the cell, and cell 110 conducts a relatively high current (above a predetermined upper threshold level, e.g. 100 microamps). Conduction of such high level current is indicative of a first state, e.g., a zero or logical low. On the other hand, if the selected cell 110 has been programmed ($V_T > V_{T2}$), gate voltage $V_G$ is less than the threshold voltage $V_{T2}$ of the cell, and the cell is non-conductive, or at least conducts less current (below a predetermined lower threshold level, e.g. 20 microamps). Conduction of such low level current is indicative of a second state, e.g., one or logical high.

In contrast to the programming procedure, flash EEPROMs are typically bulk-erased, so that all of cells 110 in array 104 (i.e. connected to a common source line CS) are simultaneously erased. Appropriate potentials applied to the source 112, drain 114, and control gate 126, cause electron tunneling from floating gate 122 to source 112 or drain 114 via Fowler-Nordheim (F-N) tunneling. For example, electrons 136B stored during programming on floating gate 122 tunnel through tunnel dielectric 120 in a tunnel region 140 where floating gate 122 overlaps source region 112. F-N tunneling occurs simultaneously for all cells 110 within memory array 104, erasing entire array 104 in one "flash" or operation.

Because each cell 110 is connected to common source line CS, all cells 110 in array 104 are erased for the same amount of time. Ideally, each cell 110 in array 104 requires the same amount of time to erase, i.e. to remove electrons 136B from floating gate 122 and achieve a lower selected threshold voltage. Erase times among cells 110 within array 104, however, differ widely. Because of the variation in erase times, each cell 110 must be erased for the amount of time required to erase the slowest cell in array 104. Erasing faster cells 110 for too long, however, results in over-erasure. Over-erasure generates a positive charge on floating gate 122, which excessively lowers the threshold voltage $V_T$ of cell 110, in some instances to the extent of establishing a negative threshold voltage ($V_T < 0$). As a result, the over-erased cell 110 may be continuously activated, even when control gate 126 is grounded ($V_G = 0$ volts), so that cell 110 always conducts during a read operation, regardless of whether over-erased cell 110 is the cell selected for reading. In addition, the increase $V_e$ in threshold voltage effected by programming, may not be sufficient to raise the threshold voltage $V_T$ of the over-erased cell above the predetermined voltage $V_G$ applied to control gate 126 of selected cell 110, so that even when programmed, the over-erased cell conducts upon application of $V_G$ during the read process, giving an erroneous reading.

The current conducted by over-erased cells 110 in a column during a read operation is known as "column leakage current." Column leakage current manifests itself by degrading or destroying the memory's reliability and endurance. As discussed above, the bit value of a selected cell 110 depends on the magnitude of the drain current provided at the associated bit line BL. Drain 114 of each cell 110 in a column, however, is connected to the associated bit line BL. Ideally, the only cell in the column biased for possible conduction is the cell in the selected word line WL; the predetermined voltage $V_G$ is applied to the gates of cells on the selected word line and all other gates are grounded during the reading process. If selected cell 110 is unprogrammed, current in excess of the upper threshold value will be provided on the bit line, indicating e.g., a zero. If the selected cell is programmed with a "1", the drain current of the cell (and, ideally, the bit line), is below the lower threshold value during the read operation. However, the current in the bit line reflects the cumulative current flow from all of the cells in a column. Accordingly, if any of the cells in the column are over-erased and conduct significant current during the read operation, the current flow in the bit line may be in excess of the upper threshold value. Consequently, the read operation generates a logical zero regardless of which cell in the column is selected or whether the selected cell is programmed. In severe cases, a single over-erased cell disables the entire column. In another case, many of the cells may be slightly over-erased which provides a cumulative column leakage current in excess of the upper threshold value. For example, if each cell in a column of 512 cells leaks 0.2 microamps, the total column leakage current is 102.4 microamps, in excess of the upper threshold value of 100 microamps, thereby disabling the entire column. Milder cases may simply degrade the performance of the memory over time, greatly reducing the reliability and endurance of the device, i.e. the number of cycles the device can be successfully programmed and erased.

The problem of over-erasure is recognized but remains unresolved in the prior art. For example, U.S. Pat. No. 5,335,198, to Van Buskirk et al., issued Aug. 2, 1994, discloses an over-erasure correction method, involving sensing an over-erase condition (i.e. when the voltage on floating gate 122 is positive) and individually programming each over-erased cell until the cell is properly erased (i.e., when the positive voltage on the floating gate 122 is eliminated). Disadvantageously, individually reprogramming all of the over-erased bits in an array of cells introduces considerable delay. If many of the cells within an array are over-erased, the time required to correct all of these cells is prohibitive. In addition, the necessary circuitry for sensing an over-erase condition occupies valuable space on the semiconductor substrate.

SUMMARY OF THE INVENTION

According to various aspects of the present invention, uniformity of erase times among cells in a memory array is improved by providing an enhanced and more consistent doping profile in the F-N tunneling region. The enhanced uniformity tends to diminish column leakage current in the memory array.

For example, in accordance with the present invention, a higher doping concentration is established in the tunneling regions of memory cells within an array by implanting an n+ dopant (e.g. arsenic) in the source region in two separate and distinct steps. For example, in accordance with one embodiment in accordance with the present invention, a first dose of n+ dopant (e.g. arsenic) is implanted in the source region. The n+ dopant is then driven deeper into the substrate using a thermal cycle. A second implant of n+ dopant is then performed at source and drain regions to complete the source junction and to form the drain junction.

In accordance with another embodiment in accordance with the present invention, the source and drain regions are implanted with a first dose of n+ dopant at a relatively large positive angle relative to perpendicular. A second dose of n+ dopant is then implanted at a relatively large negative angle.

The higher doping concentration in the tunneling region in accordance with the present invention reduces the range of erase times for the cells within the memory array, thereby reducing the range of after-erase threshold voltages among cells in the array. A reduced range of erase times reduces the number of cells that are over-erased and the degree to which they are over-erased, thereby reducing column leakage current in the memory array.

BRIEF DESCRIPTION OF THE DRAWING

The preferred exemplary embodiment of the present invention will hereinafter be described in conjunction with the appended drawing, where like designations denote like elements, and:

FIGS. 6A–6F are sectional views of cells in accordance with a first embodiment of the present invention at various stages of fabrication including an intermediate n+ implant MDD1 performed after DDI and before the thermal cycle;

FIGS. 8A–8F are sectional views of cells in accordance with a second embodiment of the present invention at various stages of fabrication including two steps for performing large angle n+ implants.

DETAILED DESCRIPTION OF A PREFERRED EXEMPLARY EMBODIMENT

Figure 3:
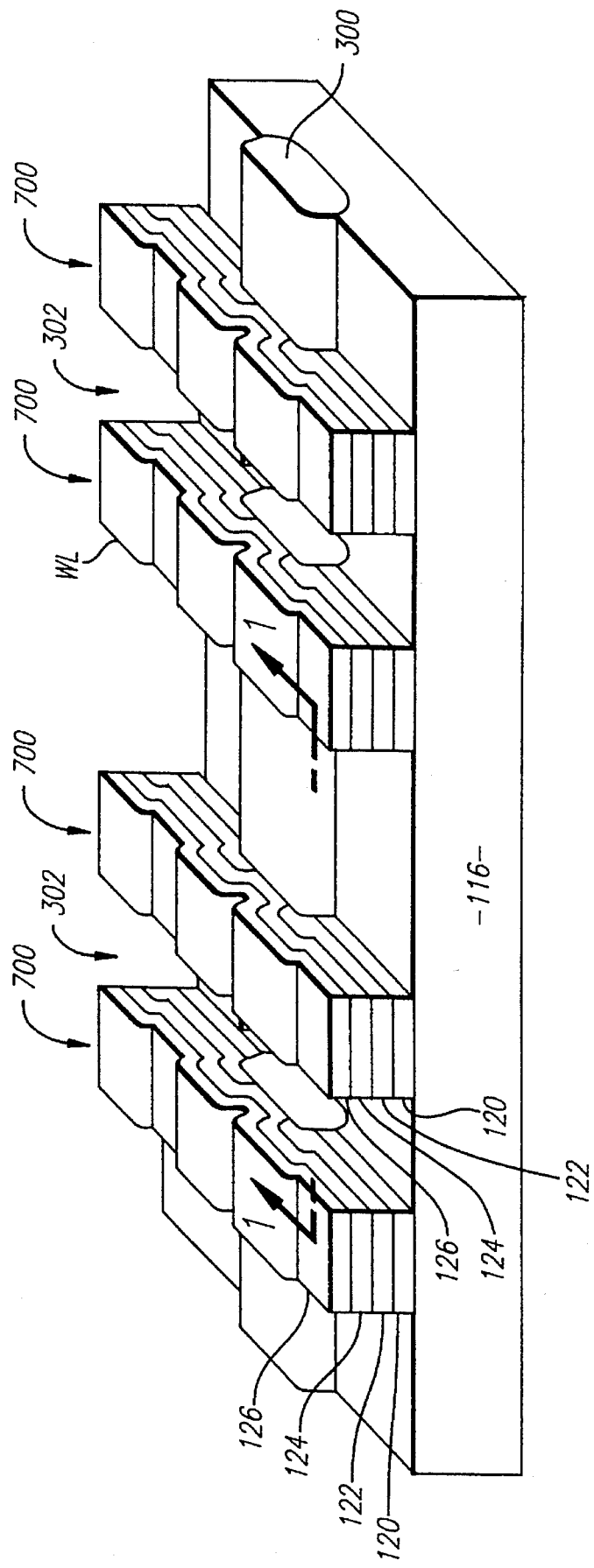
FIG. 3 is an enlarged perspective view of a number of cells 110 within array 104 of FIG. 2.
Figure 4:
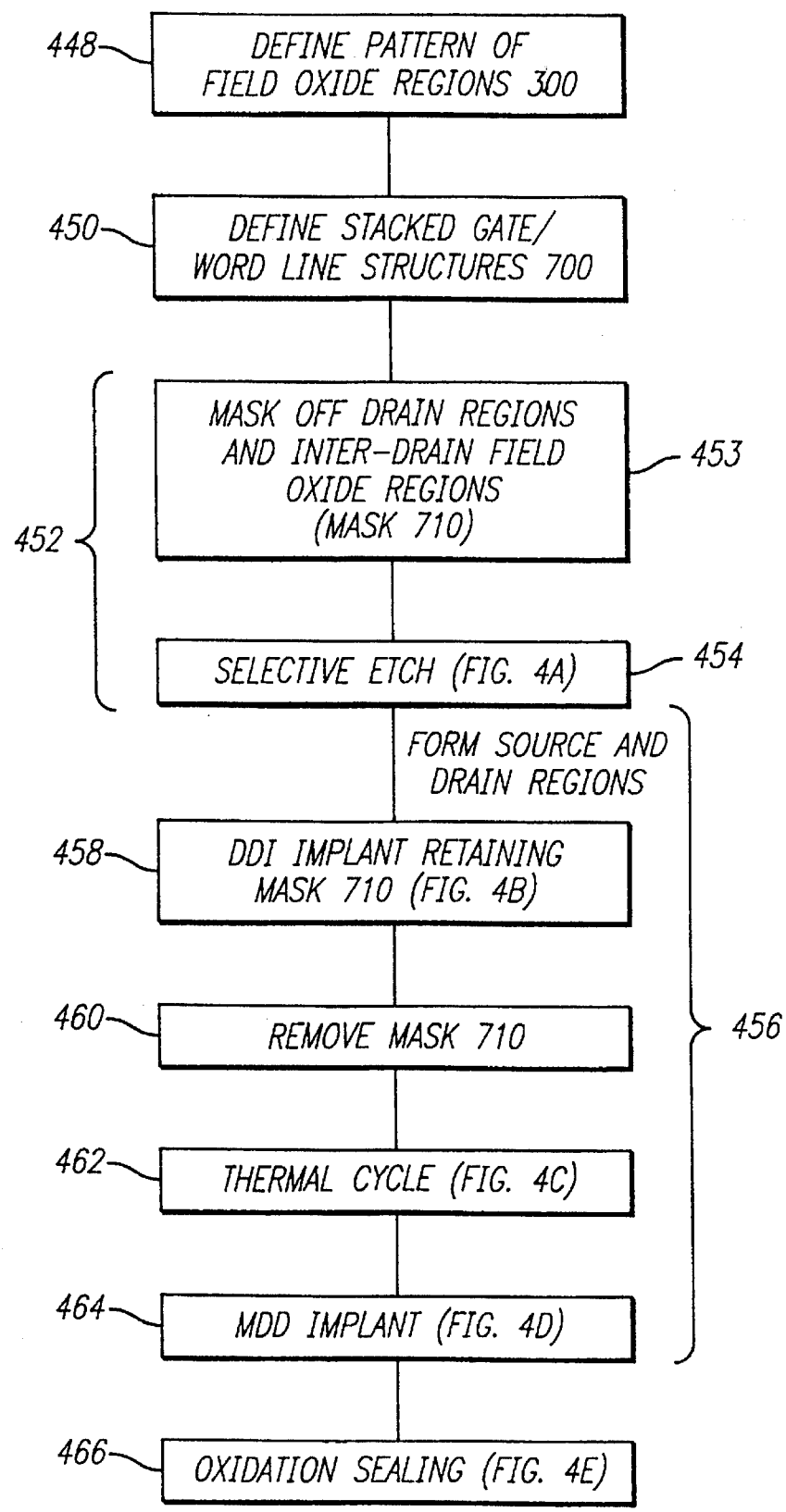
FIG. 4 is a flowchart of the fabrication process shown in FIGS. 4A–4E.

Referring to FIGS. 3 and 4, in forming of an array 104 of memory cells 110 such as used in a conventional EEPROM 100, generally, a pattern of field oxide regions 300, and stacked gate-word line structures 700 (Steps 448–454, FIG. 4) are initially formed on a suitable substrate 116 (e.g., silicon implanted with p-type dopants, such as boron), then dopants are implanted in exposed regions of substrate 116 (in predetermined disposition to stacked gate structures 700) to form the source and drain regions of the respective cells 110 (Step 456).

Field oxide regions 300, which provide electrical isolation of the various columns of cells, may be formed in any suitable manner (Step 448, FIG. 4). For example, a field oxide layer is conventionally formed on substrate 116, then selectively removed (patterned) from above regions of the substrate where cells 110 are to be formed. In general, within the core (array 104), the patterning process results in alternating parallel strips of field oxide 300 and exposed regions corresponding to the columns of cells 110 in the array. This may be effected by, for example: growing a layer of thermal oxide ("barrier oxide" or "pad oxide"), over the surface of substrate 116; depositing a masking layer, frequently composed of nitride, on the barrier oxide over the core region; patterning the masking layer to overlie regions of the substrate where cells 110 are to be formed; growing the field oxide on the exposed areas of the barrier oxide by local oxidation of silicon, or LOCOS; stripping the masking layer to expose the underlying barrier oxide; and removing (e.g. etching) the exposed barrier oxide.

In the completed array 104, stacked gate-word line structures 700 function as: the tunnel dielectric 120; floating gate 122; interpoly dielectric 124; and control gate 126 of the respective cells 110 of array 104, integral to a common word line (WL) for the cells of each row in array 104. Stacked gate-word line structures 700 may be formed in any suitable manner (Step 450). For example, tunnel dielectric 120, suitably comprising a thin (e.g. approximately 100 angstroms) layer of oxide, is initially formed on substrate 116 by any suitable technique, such as, for example, thermally oxidizing the surface of substrate 116 or by depositing a suitable material on substrate 116. A layer of suitable conductive polysilicon (e.g., polycrystalline silicon), that will ultimately form floating gates 122, is typically then formed on tunnel dielectric 120 layer. For example, conductive polysilicon may be deposited by any suitable technique, e.g., conventional chemical vapor deposition (CVD). The polysilicon layer is typically then masked and etched to remove strips overlying field oxide regions 300, leaving isolated strips of polysilicon on top of tunnel dielectric 120 overlying the substrate regions corresponding to the columns of cells 110 of array 104 (i.e. the regions in which source, channel, and drain regions of cells in the column will be formed). A layer of suitable dielectric material, such as, e.g., an oxide-nitride-oxide (ONO) layer, that will ultimately form interpoly dielectric 124 is typically then formed by any suitable technique. For example, where interpoly dielectric 124 is ONO, it is suitably formed by growing a layer of oxide, depositing a layer of nitrate, followed by growing another layer of oxide. Interpoly dielectric 124 layer, in the completed array, insulates control gates 126 from floating gates 122 in the individual cells and fills the interstices between (and electrically isolates) the adjacent columns of floating gates 122 in array 104. Another layer of suitable conductive polysilicon (e.g., polycrystalline silicon), that will ultimately form control gates 126 (and word lines WL connecting the control gates of the cells in the respective rows of array 104) is typically then deposited on the interpoly dielectric layer, by any suitable technique, such as, for example, by conventional chemical vapor deposition (CVD). Portions of the respective polysilicon and interpoly dielectric layers are typically then selectively removed, to define stacked gate structures 700 on tunnel dielectric layer 120, i.e., to form the floating gates 122, interpoly dielectric layer 124 and control gates 126 of the individual cells, and word lines WL (portions of the interpoly dielectric and control gate polysilicon layers, bridging field oxide regions 300, to connect the respective cells of the rows of the array). This is typically effected by suitable masking and etching techniques. Conventionally, tunnel dielectric 120 acts as a stop layer for this etch, resulting in removal of some or all of tunnel dielectric 120 overlying source 112 and drain 114 regions during the etch. For example, tunnel dielectric 120 in the figures does not overlie drain 114, which occurs when this portion of tunnel dielectric 120 is removed by the etching of the layers to form the stacked gate-word line structures 700.

Figure 1:
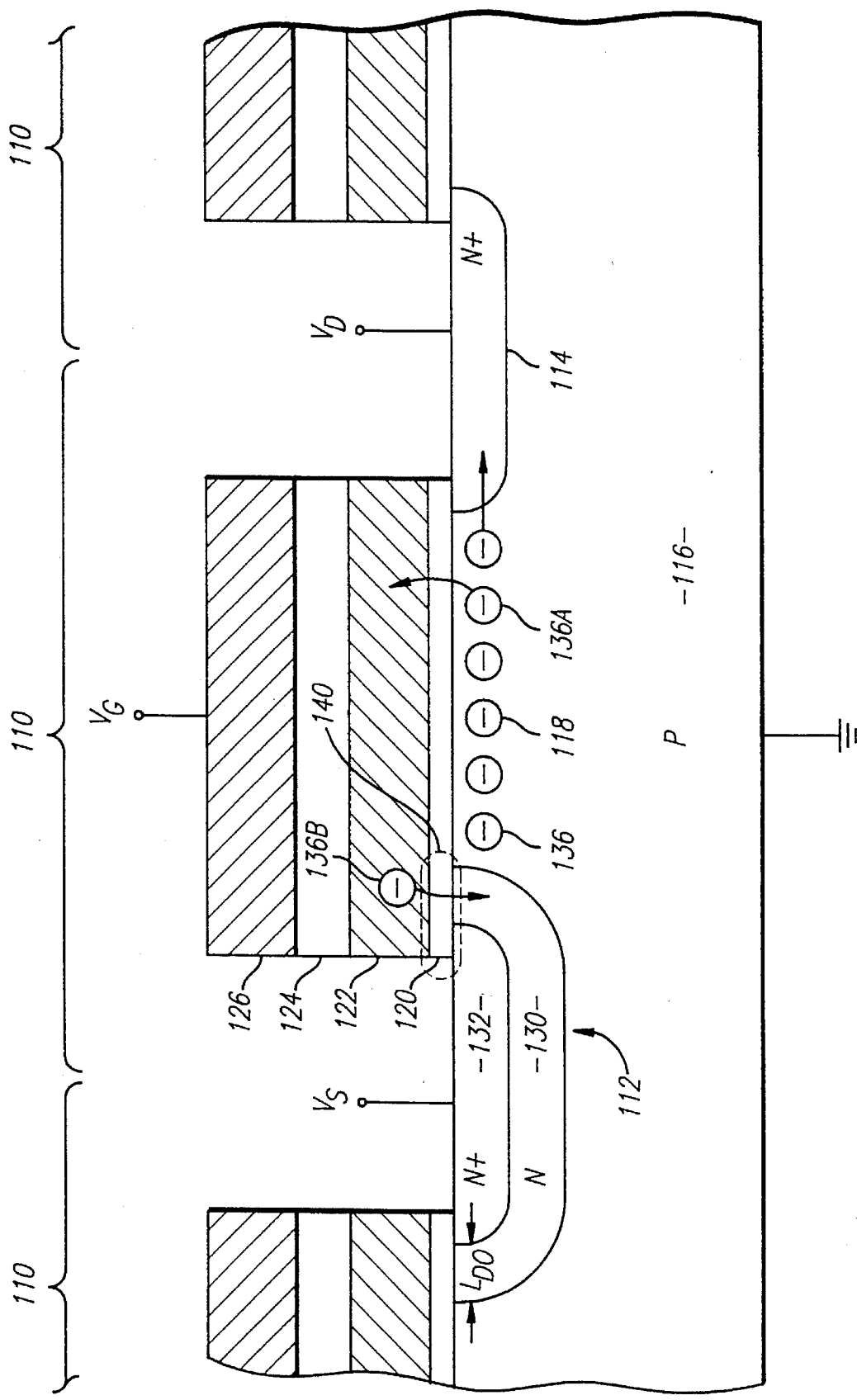
FIG. 1 is a cross-sectional view of a conventional EEPROM cell 110 taken along the line 1—1 in FIG. 3.
Figure 2:
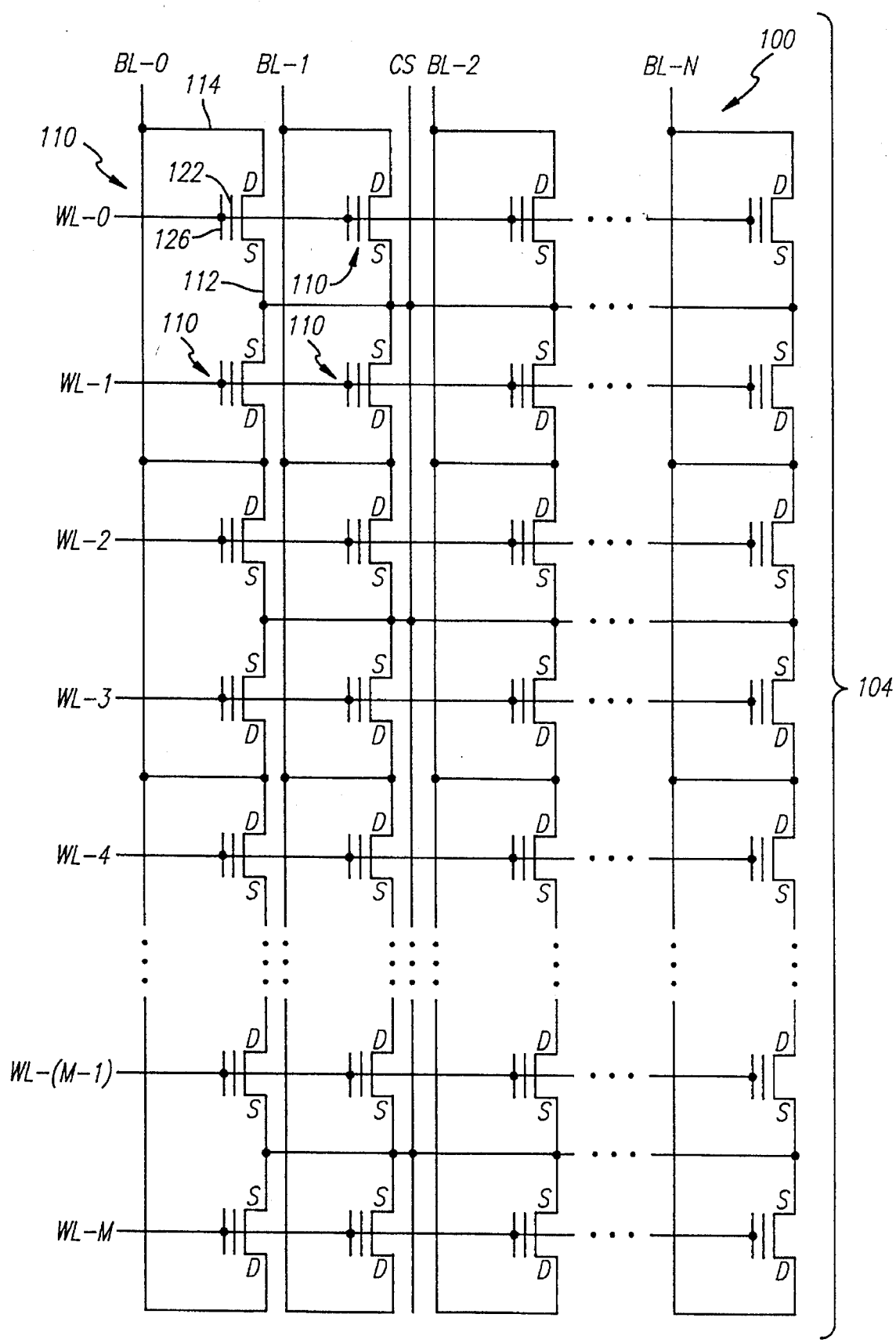
FIG. 2 is a schematic diagram of an array 104 of flash EEPROM cells 110 of FIG. 1 in a typical flash EEPROM 100.

The portions of field oxide 300 and tunnel dielectric 120 between every second pair of adjacent word lines 700 in array 104 (i.e., the regions generally indicated as 302) are then typically removed (Step 452), in preparation for formation of the common line (CS, FIG. 2) connecting the sources. Referring briefly to FIG. 1, in the completed array, the source 112 of each cell in a column (excepting end cells) is formed in a common region with one of the adjacent cells, e.g., the preceding cell in the column. Likewise, the drain of the cell is formed in a common region with the drain 114 of the other adjacent cell, e.g. , next succeeding cell in the column. Referring again to FIG. 3, additionally, the sources of each cell 110 in a row (and hence pairs of rows) are formed as a common region, facilitating formation of common source line CS (FIG. 2). The drains of cells in adjacent rows at this point in the fabrication process remain electrically isolated by field oxide 300.

Figure 4A:
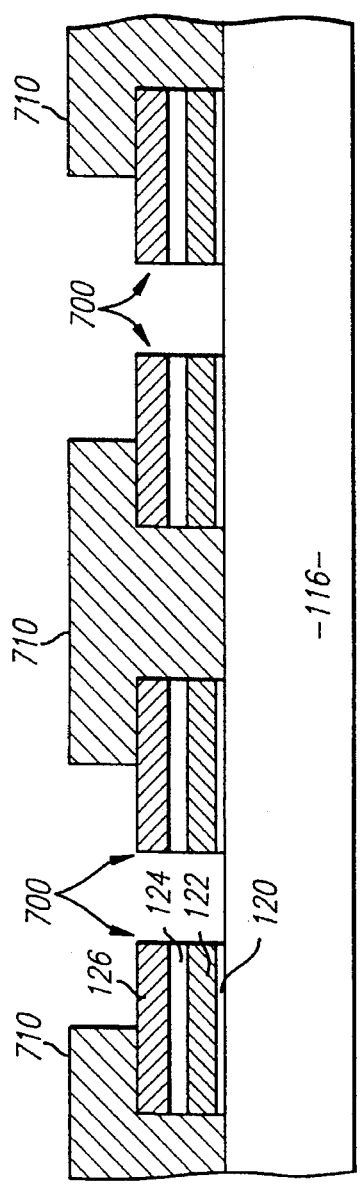
FIGS. 4A–4E are sectional views of conventional cells 110 at various stages of fabrication.
Figure 4B:
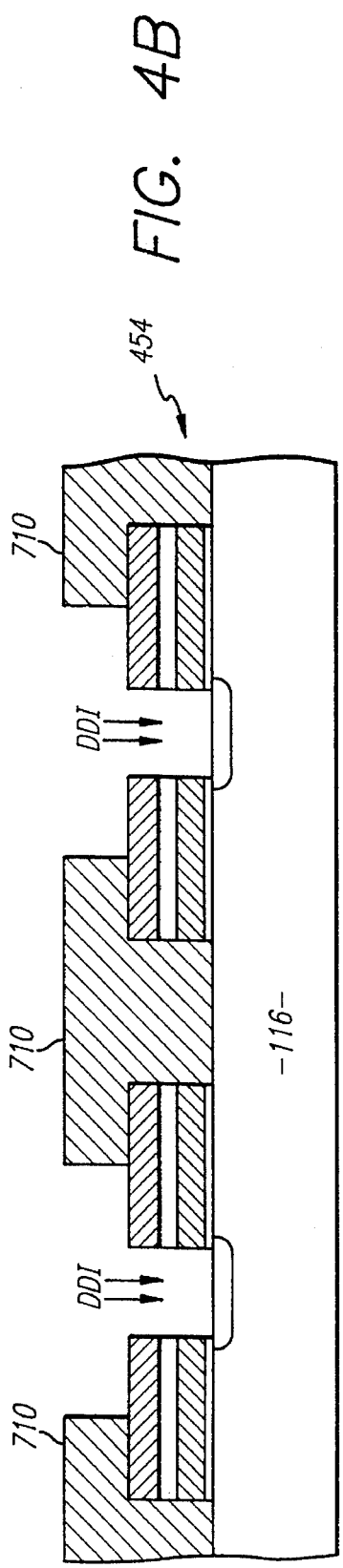

Accordingly, a masking layer of photoresist is deposited over array 104, then patterned with regions 710 to mask the drain regions and field oxide regions between the drains of corresponding cells in adjacent rows, while exposing regions 302, i.e., the tunnel dielectric 120 overlying the portions of substrate 116 where source regions 112 are to be formed and the portions of field oxide 300 disposed between source regions 112 of the corresponding cells of adjacent columns (Step 453). The edges of each opening of the mask are typically aligned to rest on the word lines of adjacent rows of cells, covering drain regions 112 and the field oxide regions isolating the drains of cells in adjacent columns. Once masked, a highly selective etch, e.g., a conventional Self-Aligned Source (SAS) etch, is performed to remove the exposed field oxide 300 (Step 454). For example, a conventional SAS etch is described in U.S. Pat. No. 5,120,671, issued Jun. 9, 1992, to Tang et al. When completed, this etch creates the structure shown in FIG. 4A. As will be discussed, the selective etch typically removes not only the exposed field oxide regions 300, but also the exposed tunnel oxide 120, and a portion of the underlying substrate 116.

Figure 4C:
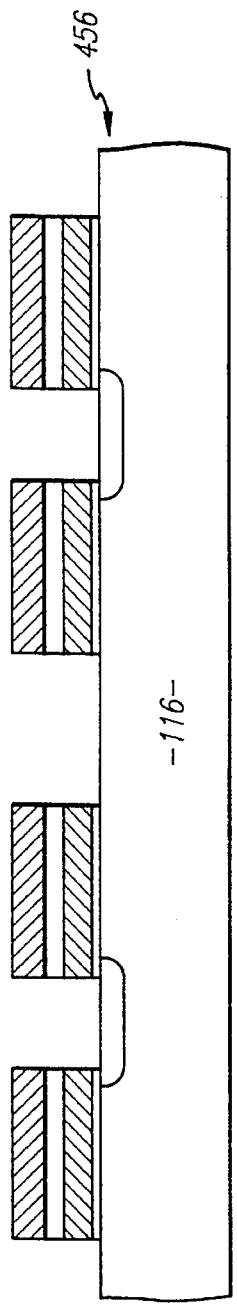

Source 112 and drain 114 regions are then formed (Step 456). Referring now to FIGS. 4, and 4A–4F, source regions 112 (and common line CS) are conventionally formed by initially implanting n-type dopants with a conventional double diffusion implant (DDI) while retaining mask 710 (Step 458). The DDI implants a first dopant, suitably phosphorous, to form a deeply diffused but lightly doped N well 130 (FIGS. 1 and 4B), establishing a graded source-channel junction. The photoresist comprising mask 710 is then removed (Step 460). The DDI implant is typically driven deeper into substrate 116, as shown in FIG. 4C, by subjecting substrate 116 to a thermal cycle at high temperature (e.g. 1050 degrees Fahrenheit)(Step 462).

Figure 4D:
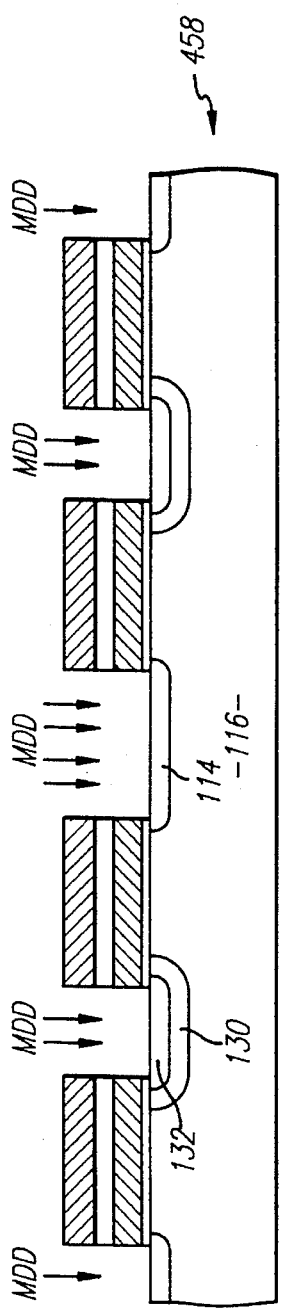

A shallow second implant, commonly referred to as a medium diffused drain (MDD) implant, is then performed (e.g., with arsenic) (Step 464) to create a more heavily doped, but shallower, n+ well 132 embedded within deep N well 130 (FIG. 4D). The MDD implant also forms a shallow, abrupt drain 114. This implantation process tends to result in a cell manifesting source and drain doping profiles (relative to the source-channel and drain-channel junctions respectively) shown in FIG. 4F.

Figure 4E:
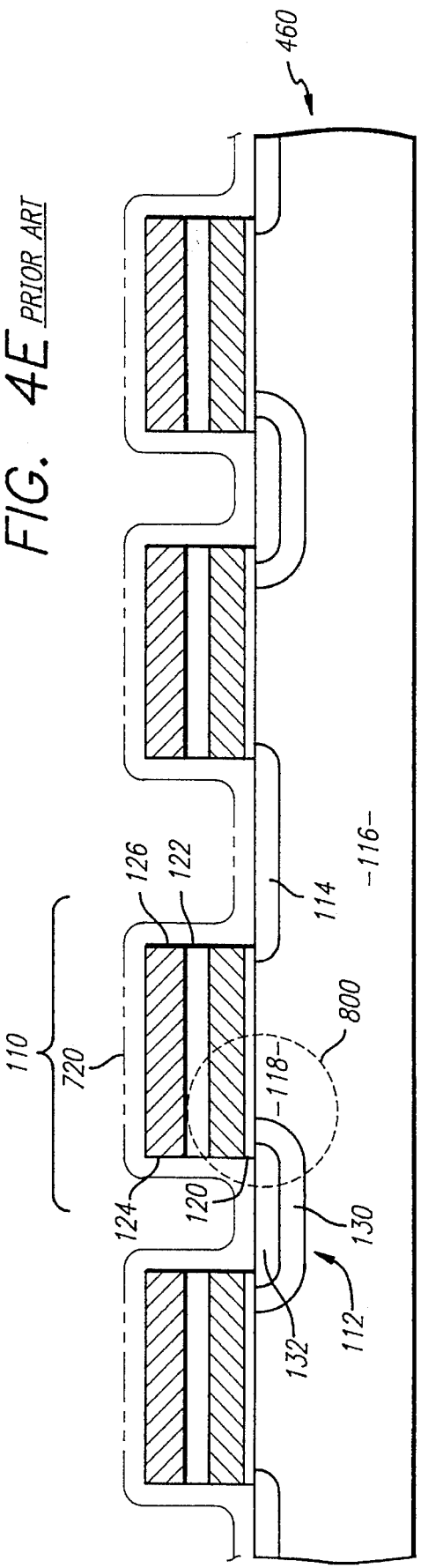
Figure 4F:
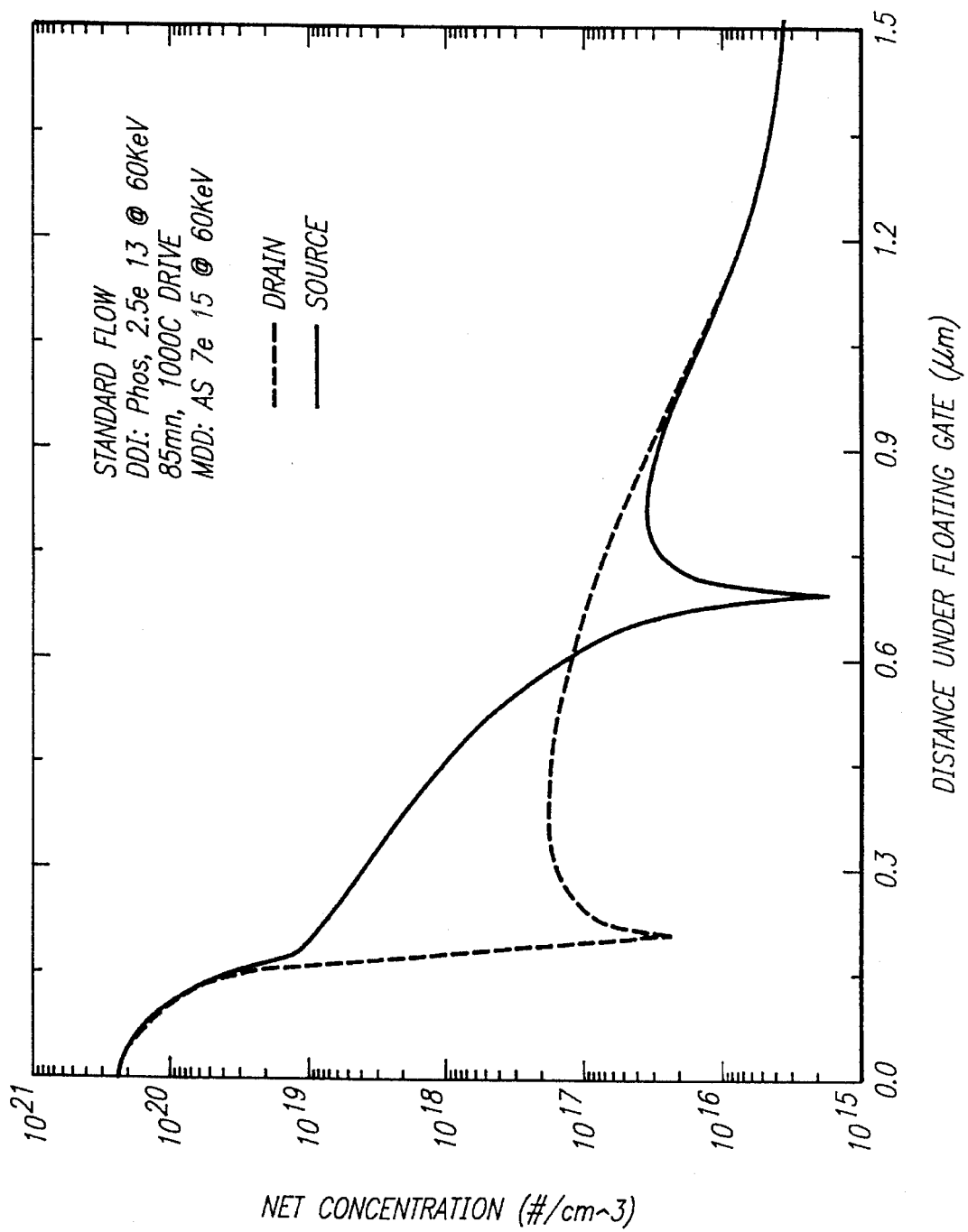
FIG. 4F is a graphical representation of net doping concentration with respect to junction depth for the source and drain regions for cell 110 of FIG. 1.

The entire device is then oxidized (Step 466) to form a sealing layer 720 of silicon dioxide (FIG. 4E). The EEPROM 100 is then conventionally finished and packaged for distribution.

It has been found that the disparity of erase times in conventional EEPROM cells 110 within array 104 is caused, at least in part, by structural and doping variations among cells 110. For example, the erase time of cell 110 is affected by the F-N tunneling rate through tunnel dielectric 120, which, in turn, varies inversely with the square of the distance between floating gate 122 and source 112 in tunneling region 140. The geometry of each cell 110 near tunneling region 140, however, is difficult to control without significantly increasing the size of each cell. For example, referring to FIG. 5, the final oxidation (layer 720, step 460) of EEPROM 100 typically deforms floating gate 122, causing a rounding 123 of floating gate 122 in tunneling region 140. The shape and extent of the rounding 123 affects the distance across tunnel dielectric 120, and thus the erase time of each cell 110. Because the rounding effect is different among various cells 110 in array 104, erase times among cells 110 likewise vary.

It has also been determined that F-N tunneling is affected by the doping concentration of tunneling region 140 near source 112, specifically at the surface of channel 118; higher density doping at the surface tends to provide higher rates of F-N tunneling. At the surface of channel 118, the higher doping density results in less voltage drop in the silicon, which provides for more voltage across tunnel dielectric 120, thereby enhancing the F-N tunneling rate. The differences in cell 110 geometries, however, not only affect the distance between floating gate 122 and source 112, but may also affect the doping concentration of source 112 in tunneling region 140 in each cell. As previously noted, a highly selective etch, e.g., a conventional Self-Aligned Source (SAS) etch, is performed to remove the portions of field oxide 300 disposed between source regions 112 of the corresponding cells of adjacent rows (Step 454). This etch is selective in that it etches the field oxide at a much higher rate than the polysilicon word line. However, tunnel dielectric 120 overlying the portions of substrate 116 where source regions 112 are to be formed is also subject to the etch, and the etch operates upon tunnel oxide 120 at the same rate as field oxide 300. Field oxide 300 is typically considerably thicker (e.g., 3000 Angstroms) than tunnel oxide 120 (e.g., 100 Angstroms). By the time field oxide 300 is removed, not only has the etch removed the gate oxide 120 overlying the source region, but it has also removed a portion of the silicon substrate in the source region. More specifically, referring to FIG. 5, the selective etch (Step 454) typically removes a portion of substrate 116, producing a gouge of depth $D_G$ in upper surface 113 of source region source 112. The depth $D_G$ of the gouge in source region 112 and the profile of surface 113 significantly affect the diffusion of dopants into tunneling region 140. In particular, the gouge increases the distance through which the dopants must travel to extend to the surface of channel 118. Consequently, the gouge in surface 113 tends to decrease doping concentration in source 112 in tunneling region 140 when compared to an ungouged surface.

According to various aspects of the present invention, erase times are improved (and hence, leakage current is reduced) by improving the doping profile in tunneling region 140 of substrate 116, i.e. moving the dopants farther under floating gate 122. For example, for flash EEPROM devices in accordance with one aspect of the present invention, the n+ portion 132 of source region 112 underlies floating gate 122 by a greater extent than does the n+ drain region 114. Further, the ratio of the doping profile of n+ dopant (e.g. arsenic) in source region 112 in a predetermined portion of the tunneling region 140 to the doping profile of n+ dopant in the corresponding portion of drain region 114 (e.g. at the same predetermined distance from the edge of and underlying floating gate 122) is suitably in the range of 1.1 to 10, preferably in the range of 1.2 to 5, and most preferably in the range of 1.5 to 3.

Figure 6:
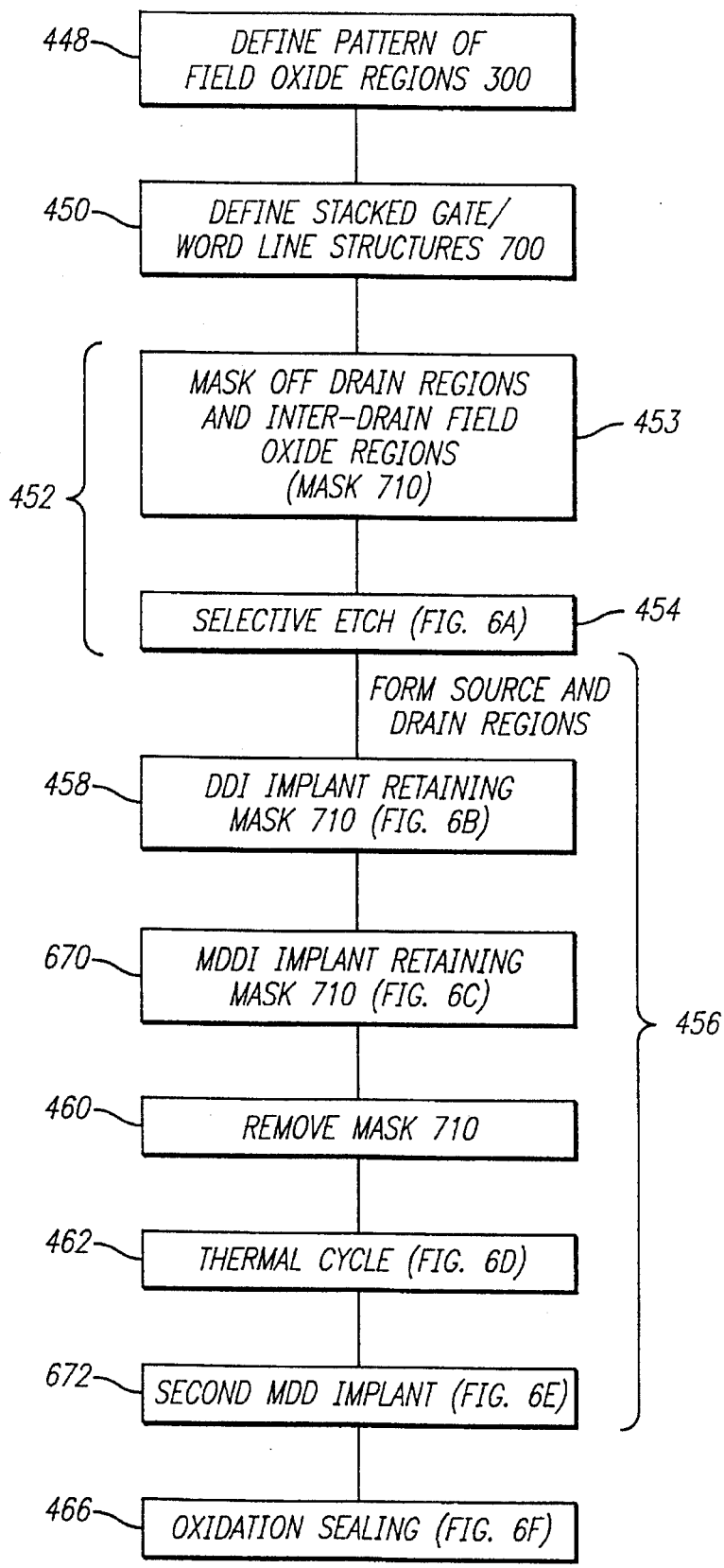
FIG. 6 is a flowchart of the fabrication process shown in FIGS. 6A–6F.
Figure 6A:
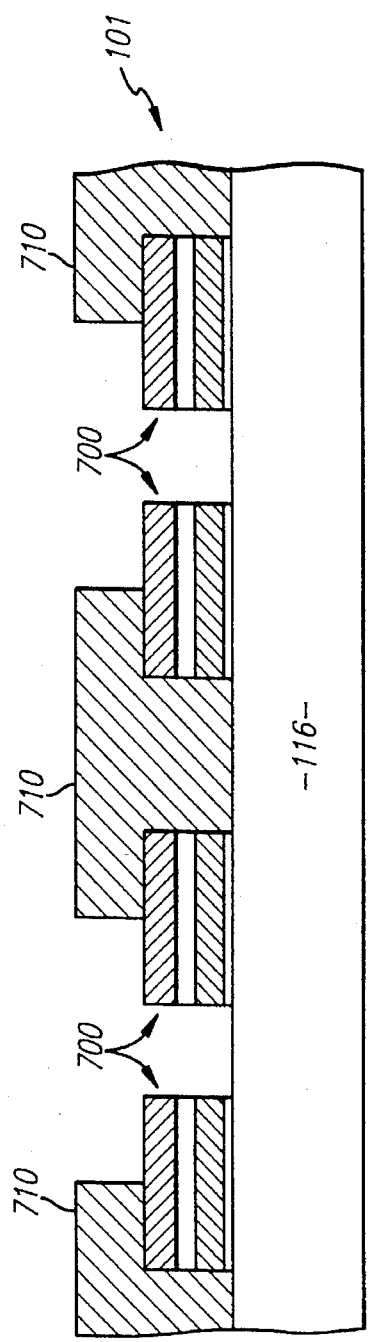
Figure 6B:
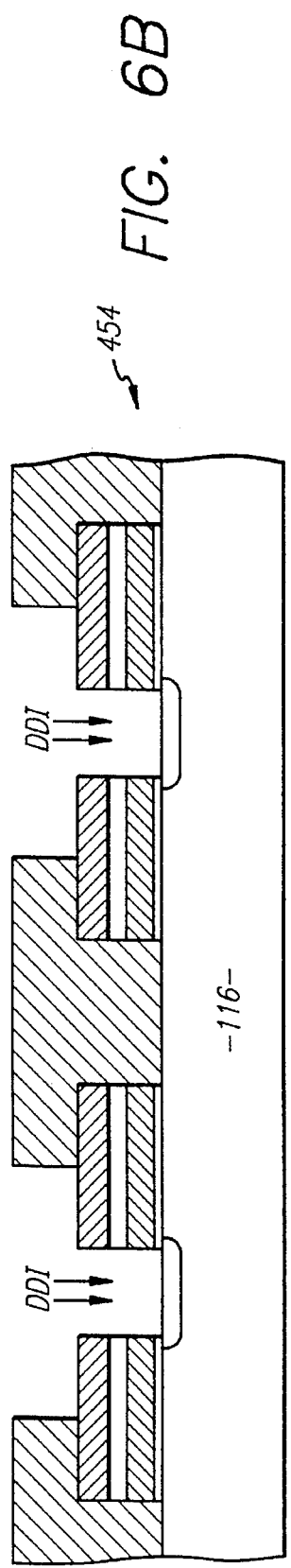
Figure 6C:
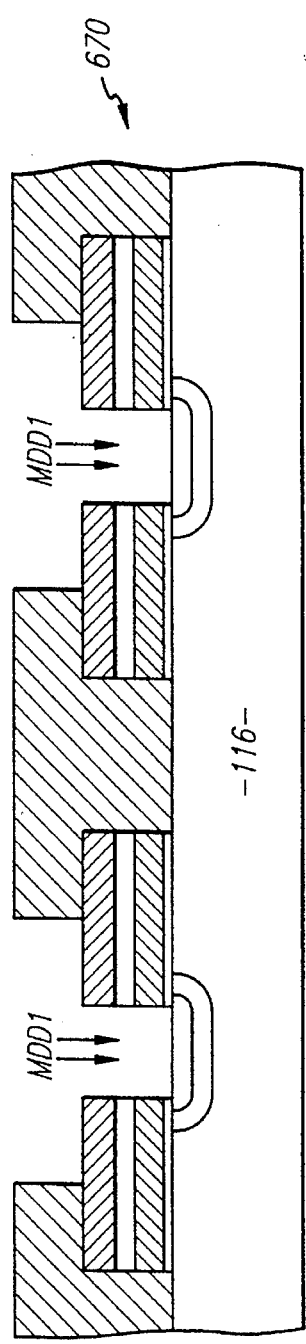

Referring now to FIGS. 6 and 6A–6F, an EEPROM 101 with improved column leakage current characteristics has cells 106 fabricated using an intermediate n+ implant in source 112 to increase the doping concentration in tunneling region 140. An intermediate n+ implant MDD1 may suitably be added immediately following the DDI implant (FIG. 6B) and preceding the thermal cycle (FIG. 6D). The initial steps of the fabrication process, such as forming field oxide regions 300 (Step 448) and gate structures 700 (Step 450), effecting the mask 710 and selective etch to selectively remove source tunnel dielectric 120 and field oxide 300 (Step 452), and the initial DDI (Step 458), may be effected in any suitable manner, for example, as previously described in relation to FIGS. 3 and 4A–4B. Prior to the thermal cycle to drive the DDI implant deeper, however, intermediate n+ implant MDD1 adds further dopants (e.g. arsenic) (step 670, FIG. 6G) to source 112 (FIG. 6C). MDD1 provides a first predetermined dose of dopant, suitably less (e.g. 80%) than conventional MDD doses (e.g. $6 \times 10^{15}/cm^2$), such as the full MDD dose of FIG. 4D. The dose of MDD1 may vary from a small percentage of a conventional MDD dose all the way up to the full MDD dose (or more). However, the higher the dose of MDD1, the deeper the junction will be driven during the subsequent thermal cycle. Doses beyond a certain level potentially increase undesirable short-channel effects (e.g. drain-induced barrier lowering (DIBL, or punch-through)). In general, the first predetermined dose of dopant provided by MDD1 is in the range of $1 \times 10^3/cm^2$ to $15 \times 10^{15}/cm^2$, and preferably, in the range of $5 \times 10^{14/cm2}$ to $7 \times 10^{15}/cm^2$, and most preferably, in the range of $1 \times 10^{15}/cm^2$ to $5 \times 10^{15}/cm^2$. Following the intermediate n+ implant, mask 710 is suitably removed, and the DDI and intermediate n+ implant are suitably driven deeper into substrate 116 with the thermal cycle described above.

Performing the intermediate n+ implant MDD1 immediately after the DDI implant allows mask 710 to be used for the MDD1 implant as well as for the DDI implant. Thus, MDD1 only requires the addition of one process step, namely, the implantation step. No additional masking or etching steps are required, making the addition of MDD1 into the standard process flow of the prior art very efficient and cost-effective.

Following the intermediate n+ implant MDD1, a second n+ implant MDD2 is suitably provided (step 672) to implant a second predetermined dose of n+ dopants (FIG. 6E). In general, the second predetermined dose of dopant provided by MDD2 is in the range of $1 \times 10^{14}/cm^2$ to $15 \times 10^{15}/cm^2$, and preferably, in the range of $5 \times 10^{14}/cm^2$ to $10 \times 10^{15}/cm^2$, and most preferably, in the range of $2 \times 10^{15}/cm^2$ to $6 \times 10^{15}/cm^2$.

Figure 7:
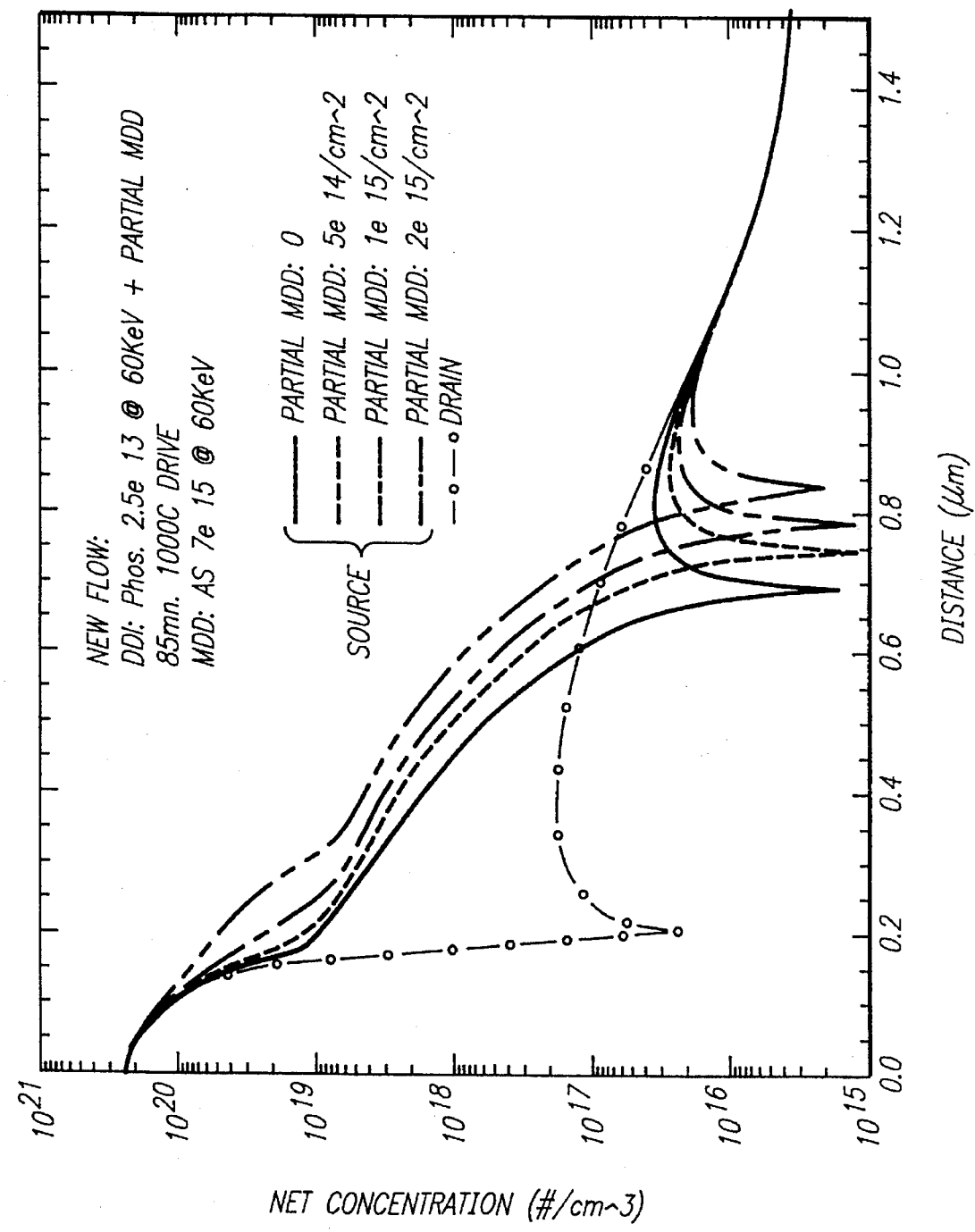
FIG. 7 is a graphical representation of net doping concentration with respect to junction depth for the source and drain regions for the cell of FIG. 6F.

The dose provided by MDD2 is suitably the full dose provided by a conventional MDD. Alternatively, the dosage of MDD2 may be reduced by the amount of the intermediate n+ implant MDD1 already performed. Providing intermediate n+ implant MDD1 with a full n+ implant dose MDD2 suitably further enhances the doping concentration in tunneling region 140. Finally, oxide layer 720 may be grown over the array (step 460), as shown in FIG. 6F. The process of FIGS. 6 and 6A–6F tends to result in a cell 106 manifesting source and drain doping profiles (relative to the source-channel and drain-channel junctions respectively) shown in FIG. 7.

Figure 5:
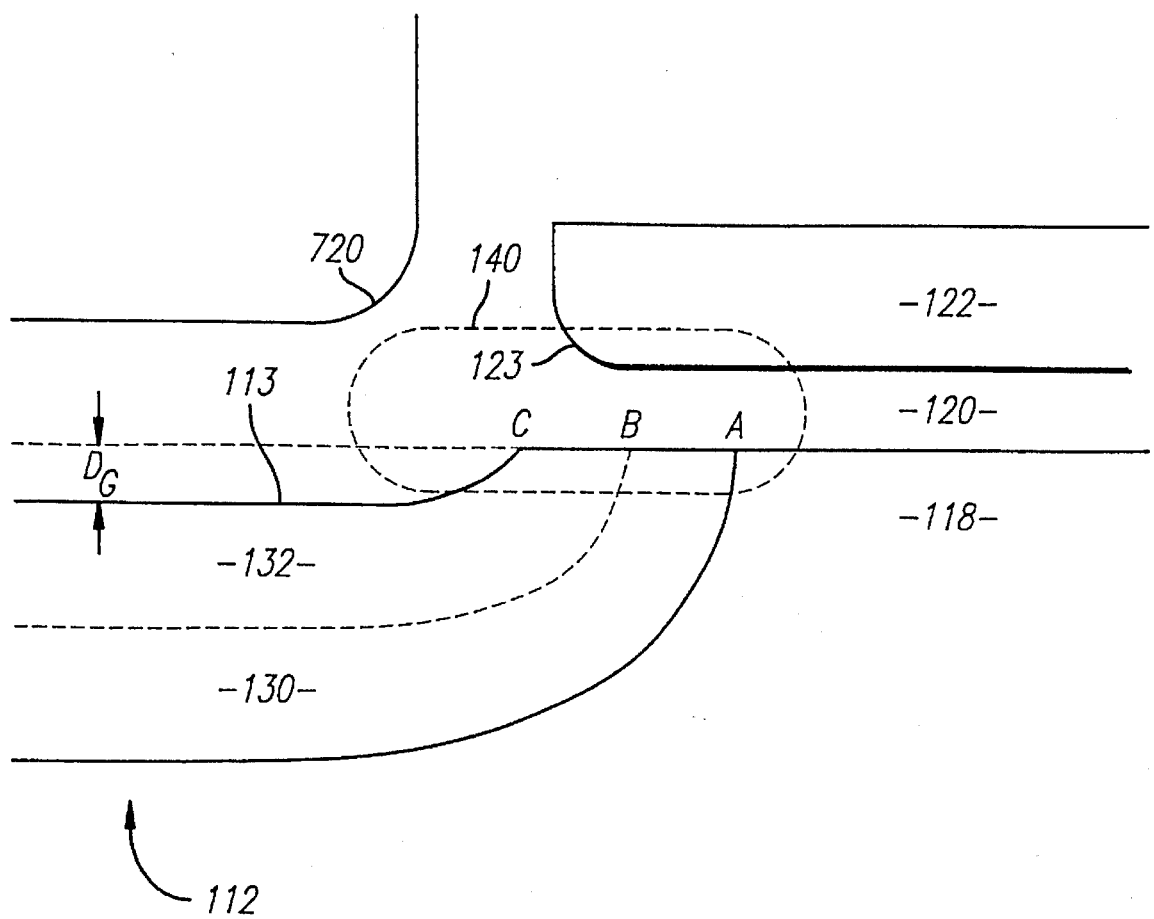
FIG. 5 is a sectional view of the circular region 800 shown in FIG. 4E.

Performing a thermal cycle (step 456) following the intermediate n+ implant (step 670) tends to drive a higher concentration of n+ dopant into tunneling region 140 of source 112 (i.e. the portion of source region 112 overlapped by floating gate 122). This not only enhances the uniformity of erase times among cells 106 in array 104, but, additionally, increases the rate of F-N tunneling, and thus provides a faster erase time while maintaining the same cell size. The doping concentration in tunneling region 140 depends on how deeply the implants (e.g. DDI, MDD1 and MDD2) are driven into substrate 116. Referring to FIG. 5, the doping concentration at the junction of deep well 130 and substrate 116 is light, and is typically heaviest near the upper surface of source 112. Thus, based on doping concentration, F–N tunneling is more likely to occur in region B–C than in region A–B.

Driving the n+ dopants deeper into substrate 116 also reduces the effects of gouging in source region 112. Since the n+ dopants diffuse more freely during the thermal drive, a higher concentration of n+ dopants is created near the surface of channel 118 in tunneling region 140. In addition, driving the n+ dopants deeper into substrate 116 reduces the effects of rounding 123 of floating gate 122, since higher concentrations of n+ dopants are driven past rounding 123. Thus, the intermediate n+ implant MDD1 and subsequent thermal drive tend to compensate for variations in the geometry (i.e. gouging of source region and rounding of floating gate 122) in tunnel region 140 to provide greater tunneling rate uniformity (and hence, erase time,uniformity). More uniform erase time in cells 106 decreases the column leakage current in array 104.

Figure 8:
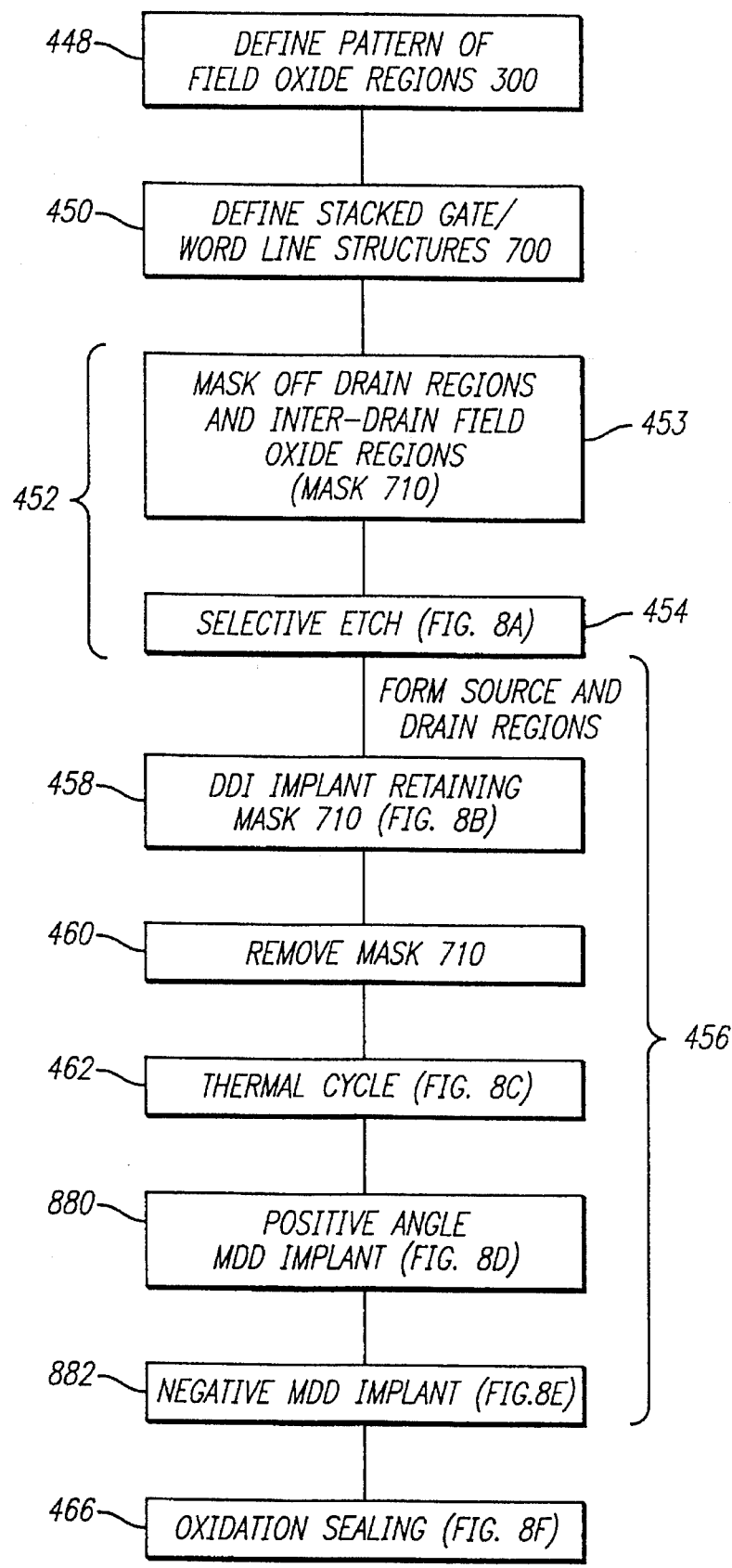
FIG. 8 is a flowchart of the fabrication process shown in FIGS. 8A–8F.

In an alternative embodiment, the n+ implant for source region 112 may be performed at an angle to increase uniformity of erase time. Referring now to FIGS. 8 and 8A–8F, as with respect to the process of FIG. 6, the initial steps of the fabrication process, such as forming field oxide regions 300 (Step 448) and gate structures 700 (Step 450), effecting mask 710 and the selective etch (e.g. SAS etch) to selectively remove field oxide 300 (Step 452), and the initial DDI (Step 458), may be effected in any suitable manner, for example, as previously described in relation to FIGS. 3 and 4A–4B. Likewise, a thermal cycle (step 456) (FIG. 8C) is effected after the initial DDI, suitably as described in conjunction with FIG. 4C. The n+ implant, however, is suitably effected at an angle, for each source channel junction. First, as shown in FIG. 8D, a predetermined percentage (e.g., 10% to 100%, and preferably half) of the full n+ dose MDD1 is implanted at a relatively large positive angle (e.g. suitably +7 to +50 degrees, and preferably, +20 to +40 degrees, and most preferably approximately +30 degrees) relative to perpendicular (step 880). Similarly, as shown in FIG. 8E, the other half of the n+ dose MDD2 is implanted at a negative angle (step 882) corresponding to the relatively large angle used in the first step (e.g., most preferably approximately −30 degrees). After the two n+ implant steps (MDD1 and MDD2), oxide 720 may be grown over the entire structure (step 460), as shown in FIG. 8F.

Figure 9:
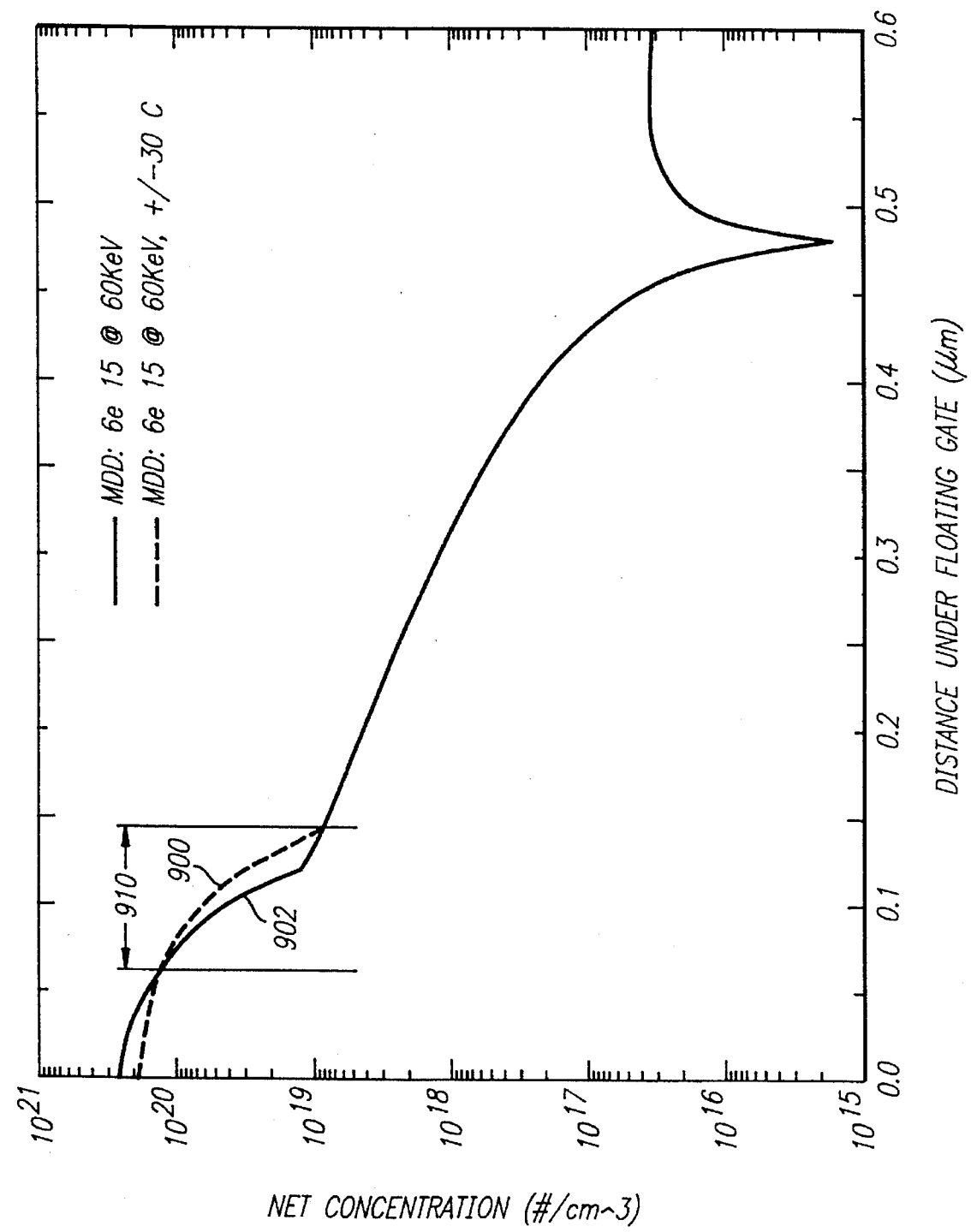
FIG. 9 is a graphical representation of net doping concentration with respect to junction depth for the source and drain regions for the cell of FIG. 8F.

Advantageously, implanting the n+ dopant at an angle reduces the undesirable effect of the gouging in source region 112 caused by the highly selective, e.g. SAS, etch (step 452). By implanting the n+ dopant at an angle, a greater proportion of the dose is available at the portion of source 112 closest to floating gate 122, causing the n+ dopant to be diffused under floating gate 122. This tends to increase the doping concentration in tunneling region 140, which correspondingly tends to decrease erase time for slower memory cells 106. Thus, the range of erase times among cells 110 in array 104 may diminish, resulting in a smaller column leakage current. The process of FIGS. 8 and 8A–8F tends to result in a cell manifesting source and drain doping profiles (relative to the source-channel and drain-channel junctions respectively) shown in FIG. 9. The doping concentration (generally indicated as 900) for the angled n+ implant at the edge (0.0, in FIG. 9) of floating gate 122 is slightly less than the doping concentration (902) for the traditional n+ implant (e.g. from the edge (0.0) of floating gate 122 to approximately 0.05 microns under the floating gate). However, a higher concentration is driven deeper under floating gate 122 by the angled implant: the doping concentration 900 for the angled n+ implant is greater than the doping concentration 902 for the traditional n+ implant in the region (910) extending from approximately 0.05 to 0.15 microns under floating gate 122 (FIG. 9). This higher doping concentration farther under floating gate 122 results in a faster erase time for an individual cell 106, and a more uniform erase time across the cells within the array.

More uniform doping of tunneling region 140 counteracts the negative effects of varying geometry among cells 106. As a result, each cell 106 has more uniform doping characteristics, providing enhanced uniformity of erase times. The enhanced uniformity reduces the likelihood of any cell being over-erased, thus reducing the susceptibility to column leakage current. Consequently, the endurance and reliability of EEPROM 101 may be improved.

While the angled n+ implant described above and illustrated in FIGS. 8A–8F form source and drain regions simultaneously, an angled n+ implant could also be used to form the source region with a separate, traditional n+ implant used to form the drain region. For example, the process shown in FIGS. 6A–6F could be modified so that the MDD1 implant is effected as an n+ implant performed in two steps, the first at a positive angle and the second at a negative angle. The subsequent n+ implant (FIG. 6E) would then form the drain regions, and could either augment the n+ concentration in the source regions, or leave the source regions unaffected.

Various other modifications may be made to the described method and device within the scope of the present invention. For example, while the process described shows the formation of a double-diffused source (step 454), the method in accordance with the present invention also applies to abrupt source junctions without deep well 130. Likewise, while source 112 is described herein as double-diffused, assuming cells 106 are erased from the source side, the present invention applies with equal force to cells 106 that are erased from the drain side, with either a single or double diffused drain region. In addition, the thermal cycle of the method in accordance with the present invention is described as suitably identical to the prior art thermal cycle, but it is understood that the thermal cycle in accordance with the present invention may be modified as needed to optimize the diffusion of n+ dopants into substrate 116 underlying floating gate 122.

The foregoing is a description of preferred exemplary embodiments and best mode of the invention known to the applicant at the time of filing the application. The invention is not limited to the specific forms shown. For example, modifications may be made in the design and arrangement of the elements within the scope of the invention, as expressed in the appended claims.

What is claimed is:

1. In a method for forming a memory device including an array of cells, where:

each cell comprises first and second first conductivity type semiconductor regions, a channel semiconductor region of a second conductivity type, and a selectively chargeable gate structure including a tunnel dielectric overlying the channel region, the first conductivity type being of opposite type than the second conductivity type, the first and second regions define a controlled current path through the channel region which tends to be rendered conductive in response to a voltage level at a predetermined relationship to a gate threshold level being applied to the control gate, selectively charging the gate structure raises the gate threshold level, such that conduction of the cell in response to application to the control gate of a predetermined voltage is indicative of the logical state of the cell, and the cell is dischargeable by tunneling of electrons from the gate structure through the tunnel dielectric to the first semiconductor region to remove the charge on the gate structure, and the array is formed by the steps of:

forming the cell gate structures overlying predetermined portions of an array semiconductor region of the second conductivity type corresponding to the channel regions of the cells, and forming the first and second first conductivity type regions of the cells in predetermined portions of the array semiconductor region adjacent to the channel regions, the improvement wherein, the step of forming the first and second regions of the cells comprises the steps of:

after forming the gate structures, implanting a first dose of a first conductivity type dopant in the first region; and after implanting the first dose of the first conductivity type dopant in the first region, implanting a second dose of first conductivity type dopant in both the first and second regions.

2. The method of claim 1 further including the step of:

after implanting the first dose of the first conductivity type dopant in the first region, but before implanting the second dose of the first conductivity type dopant in the first and second regions, heating the device at a predetermined elevated temperature for a predetermined period of time to drive the first dose of the first conductivity type dopant under the floating gate.

3. The method of claim 1 wherein the gate structure includes a floating gate disposed on the tunnel dielectric, a control gate, and a second dielectric layer interposed between the floating gate and the control gate.

4. The method of claim 1 wherein the same dopant is employed in both the first and second doses of first conductivity type dopant.

5. The method of claim 1 wherein the first region comprises a source region and the second region comprises a drain region.

6. The method of claim 1 wherein the first region comprises a drain region and the second region comprises a source region.

7. The method of claim 1 wherein the first dose of the first conductivity type dopant is in the range of $1\times10^{13}/cm^2$ to $15\times10^{15}/cm^2$.

8. The method of claim 1 wherein the first dose of the first conductivity type dopant is in the range of $5\times10^{14}/cm^2$ to $7\times10^{15}/cm^2$.

9. The method of claim 1 wherein the first dose of the first conductivity type dopant is in the range of $1\times10^{15}/cm^2$ to $5\times10^{15}/cm^2$.

10. The method of claim 1 wherein the second dose of the first conductivity type dopant is in the range of $1\times10^{14}/cm^2$ to $15\times10^{15}/cm^2$.

11. The method of claim 1 wherein the second dose of the first conductivity type dopant is in the range of $5\times10^{14}/cm^2$ to $10\times10^{15}/cm^2$.

12. The method of claim 1 wherein the second dose of the first conductivity type dopant is in the range of $2\times10^{15}/cm^2$ to $6\times10^{15}/cm^2$.

13. The memory device made by the method of claim 1.

14. The method of claim 1 wherein the step of implanting the first dose of the first conductivity type dopant includes the step of implanting the first dose of the first conductivity type dopant in the first region at a positive angle with respect to an axis normal to the array semiconductor region.

15. The method of claim 14 wherein the step of implanting the second dose of the first conductivity type dopant includes the step of implanting the second dose of the first conductivity type dopant in the first and second regions at a negative angle with respect to an axis normal to the array semiconductor region.

16. The memory device made by the method of claim 15.

17. The method of claim 1 wherein the first conductivity type dopant comprises arsenic.

18. The method of claim 1 further including the step of:

implanting a dose of a second first conductivity type dopant in the first region, after forming the gate structures, but before implanting the first dose of the first mentioned first conductivity type dopant.

19. The method of claim 18 wherein the second first conductivity type dopant comprises phosphorous.

20. The method of claim 18 further including the step of:

after implanting the first dose of the first mentioned first conductivity type dopant in the first region, but before implanting the second dose of the first conductivity type dopant, heating the device at a predetermined elevated temperature for a predetermined period of time to drive the first conductivity type dopants under the floating gate.

21. A method of increasing the doping concentration in tunneling regions of an array of memory cells formed in a semiconductor substrate, where:

each cell comprises first and second first conductivity type semiconductor regions, a channel semiconductor region of a second conductivity type, and a selectively chargeable gate structure including a tunnel dielectric overlying the channel region, the first conductivity type being of opposite type than the second conductivity type, the first and second regions define a controlled current path through the channel region which tends to be rendered conductive in response to a voltage level at a predetermined relationship to a gate threshold level being applied to the control gate, selectively charging the gate structure raises the gate threshold level, such that conduction of the cell in response to application to the control gate of a predetermined voltage is indicative of the logical state of the cell, and the cell is dischargeable by tunneling of electrons from the gate structure through the tunnel dielectric to the first semiconductor region to remove the charge on the gate structure, and the array is formed by the steps of:

forming the cell gate structures overlying predetermined portions of an array semiconductor region of the second conductivity type corresponding to the channel regions of the cells, and forming the first and second first conductivity type regions of the cells in predetermined portions of the array semiconductor region adjacent to the channel regions, the improvement wherein, the step of forming the first and second regions of the cells comprises the steps of:

after forming the gate structures, implanting a first dose of a first conductivity type dopant in the first region; and after implanting the first dose of the first conductivity type dopant in the first region, implanting a second dose of first conductivity type dopant in both the first and second regions.

22. A method of forming a memory device including an array of cells formed in a p-type array semiconductor region, where:

each cell comprises first and second n-type semiconductor regions, a p-type channel semiconductor region, and a selectively chargeable gate structure overlying the channel region, the gate structure includes a tunnel dielectric disposed on the channel region, a floating gate disposed on the tunnel dielectric, a second dielectric disposed on the floating gate and a control gate disposed on the second dielectric, the first and second regions define a controlled current path through the channel region which tends to be rendered conductive in response to a voltage level at a predetermined relationship to a gate threshold level being applied to the control gate, selectively charging the gate structure raises the gate threshold level, such that conduction of the cell in response to application to the control gate of a predetermined voltage is indicative of the logical state of the cell, and the cell is dischargeable by Fowler-Nordheim tunneling of electrons from the gate structure through the tunnel dielectric to the first semiconductor region the method including the steps of:

forming a field oxide on first predetermined areas of the array semiconductor region;

forming the gate dielectric on second predetermined areas of the array semiconductor region;

the first and second predetermined areas being relatively disposed in alternating strips in a first direction such that the entire array semiconductor region within the array is covered with one of the gate dielectric and the field oxide;

forming a plurality of the gate structures on the tunnel dielectric by performing the steps of:

depositing a first layer of polysilicon on the tunnel dielectric and on the field oxide;

applying a first mask to the first layer of polysilicon to protect the first layer of polysilicon substantially overlying the gate dielectric;

etching the first layer of polysilicon to remove the first layer of polysilicon substantially overlying the field oxide;

removing the first mask;

depositing a second dielectric over the first layer of polysilicon and over the field oxide;

depositing a second layer of polysilicon on the second dielectric;

applying a second mask to the second layer of polysilicon to protect strips of the second layer of polysilicon in a second direction perpendicular to the first direction;

etching the second layer of polysilicon, the second dielectric, and the first layer of polysilicon, to form word lines of the second layer of polysilicon in strips in the second direction and to form individual floating gates formed of the first layer of polysilicon at predetermined relative dispositions corresponding to the channel regions of the cells;

removing the second mask;

applying a third mask with edges aligned on the word lines to cover the second regions and to expose the field oxide between the first regions;

selectively etching the word lines and exposed field oxide to remove the field oxide at a much faster rate than the polysilicon in the word lines is removed; implanting a first dose of an n+ dopant in the first region; removing the third mask;

heating the device at a predetermined elevated temperature for a predetermined period of time to drive the first dose of the n+ dopant into the array semiconductor region underlying the floating gate;

implanting a second dose of the n+ dopant in the first and second regions, to develop a resultant n+ doping concentration in the first region that is higher than the resultant n+ doping concentration in the second region.

23. A method of forming a memory device including an array of cells formed at least in part in a p-type semiconductor array semiconductor region, where:

each cell comprises first and second n-type semiconductor regions, a p-type channel semiconductor region, and a selectively chargeable gate structure overlying the channel region, the gate structure includes a tunnel dielectric disposed on the channel region, a floating gate disposed on the tunnel dielectric, a second dielectric disposed on the floating gate and a control gate disposed on the second dielectric, the first and second regions define a controlled current path through the channel region which tends to be rendered conductive in response to a voltage level at a predetermined relationship to a gate threshold level being applied to the control gate, selectively charging the gate structure raises the gate threshold level, such that conduction of the cell in response to application to the control gate of a predetermined voltage is indicative of the logical state of the cell, and the cell is dischargeable by Fowler-Nordheim tunneling of electrons from the gate structure through the tunnel dielectric to the first semiconductor region the method including the steps of:

forming a field oxide on first predetermined areas of the array semiconductor region;

forming the gate dielectric on second predetermined areas of the array semiconductor region;

the first and second predetermined areas being relatively disposed in alternating strips in a first direction such that the entire array semiconductor region within the array is covered with one of the gate dielectric and the field oxide;

forming a plurality of the gate structures on the tunnel dielectric by performing the steps of:

depositing a first layer of polysilicon on the tunnel dielectric and on the field oxide;

applying a first mask to the first layer of polysilicon to protect the first layer of polysilicon substantially overlying the gate dielectric;

etching the first layer of polysilicon to remove the first layer of polysilicon substantially overlying the field oxide;

removing the first mask;

depositing a second dielectric over the first layer of polysilicon and over the field oxide;

depositing a second layer of polysilicon on the second dielectric;

applying a second mask to the second layer of polysilicon to protect strips of the second layer of polysilicon in a second direction perpendicular to the first direction;

etching the second layer of polysilicon, the second dielectric, and the first layer of polysilicon, to form word lines of the second layer of polysilicon in strips in the second direction and to form individual floating gates formed of the first layer of polysilicon at predetermined relative dispositions corresponding to the channel regions of the cells;

removing the second mask;

applying a third mask with edges aligned on the word lines to cover the second regions and to expose the field oxide between the first regions;

selectively etching the word lines and exposed field oxide to remove the field oxide at a much faster rate than the polysilicon in the word lines is removed;

implanting a first dose of an n+ dopant in the first region;

removing the third mask;

implanting a first dose of an n+ dopant in the first and second regions at a positive angle of 20 to 40 degrees with respect to an axis normal to the array semiconductor region; and implanting a second dose of the n+ dopant in the first and second regions at a negative angle of 20 to 40 degrees with respect to the normal axis.

* * * * *

UNITED STATES PATENT AND TRADEMARK OFFICE
CERTIFICATE OF CORRECTION

PATENT NO. : 5,482,881
DATED : January 9, 1996
INVENTOR(S) : Jian Chen

It is certified that error appears in the above-indentified patent and that said Letters Patent is hereby corrected as shown below:

Column 2, line 12, "result,," should read --result,--.
Column 2, line 63, "$V_T$," should read --$V_T$--.
Column 8, line 46, "1 X $10^3$/cm$^2$" should read --1 X $10^{13}$/cm$^2$--.
Column 8, line 47, "5 X $10^{14/cm2}$" should read --5 X $10^{14}$/cm$^2$--.

Signed and Sealed this

Twenty-sixth Day of March, 1996

Attest:

BRUCE LEHMAN

*Attesting Officer*    *Commissioner of Patents and Trademarks*